(12) United States Patent
Do et al.

(10) Patent No.: US 8,963,320 B2
(45) Date of Patent: Feb. 24, 2015

(54) INTEGRATED CIRCUIT PACKAGING SYSTEM WITH THERMAL STRUCTURES AND METHOD OF MANUFACTURE THEREOF

(75) Inventors: Byung Tai Do, Singapore (SG); Arnel Senosa Trasporto, Singapore (SG); Linda Pei Ee Chua, Singapore (SG); Wei Chun Ang, Singapore (SG)

(73) Assignee: STATS ChipPAC Ltd., Singapore (SG)

(*) Notice: Subject to any disclaimer, the term of this patent is extended or adjusted under 35 U.S.C. 154(b) by 80 days.

(21) Appl. No.: 13/528,051

(22) Filed: Jun. 20, 2012

(65) Prior Publication Data

US 2013/0087902 A1 Apr. 11, 2013

Related U.S. Application Data

(60) Provisional application No. 61/545,081, filed on Oct. 7, 2011.

(51) Int. Cl.
| | | |
|---|---|---|
| *H01L 23/10* | (2006.01) | |
| *H01L 23/34* | (2006.01) | |
| *H01L 23/495* | (2006.01) | |
| *H01L 23/48* | (2006.01) | |
| *H01L 21/00* | (2006.01) | |

(Continued)

(52) U.S. Cl.
CPC ............ *H01L 23/36* (2013.01); *H01L 23/3677* (2013.01); *H01L 23/49838* (2013.01); *H01L 23/4334* (2013.01); H01L 24/16 (2013.01); H01L 2224/16227 (2013.01); H01L 2224/16225 (2013.01)
USPC ........... 257/706; 257/675; 257/692; 257/712; 257/707; 438/122

(58) Field of Classification Search
CPC .......... H01L 2224/73265; H01L 2224/48227; H01L 2224/48247; H01L 2924/15311; H01L 2224/48465; H01L 23/3677; H01L 24/49; H01L 2924/14; H01L 23/367; H01L 23/49816; H01L 2924/15321; H01L 33/486; H01L 2224/48464; H01L 23/36
USPC ......... 257/276, 625, 633, 706, 707, 712–722, 257/747, 796, E33.075, E31.131, 257/E23.08–E23.113, E23.051; 438/122
See application file for complete search history.

(56) References Cited

U.S. PATENT DOCUMENTS

| | | | |
|---|---|---|---|
| 6,525,942 B2 | 2/2003 | Huang et al. | |
| 6,562,660 B1 * | 5/2003 | Sakamoto et al. | ............ 438/124 |

(Continued)

OTHER PUBLICATIONS

U.S. Appl. No. 13/102,052, filed May 5, 2011, Do et al.

(Continued)

*Primary Examiner* — Colleen A Matthews
*Assistant Examiner* — Junaiden Mirsalahuddin
(74) *Attorney, Agent, or Firm* — Ishimaru & Associates LLP

(57) ABSTRACT

A method of manufacture of an integrated circuit packaging system includes: forming a thermal attach cluster includes: forming a heat collector having a heat dissipation surface, forming a cluster bridge, having a thermal surface, connected to the heat collector, forming a cluster pad, having an attachment surface, connected to the end of the cluster bridge opposite the heat collector; connecting an integrated circuit to the thermal attach cluster; and forming an encapsulation over the thermal attach cluster with the heat dissipation surface, the thermal surface, and the attachment surface exposed from and coplanar with the encapsulation.

9 Claims, 7 Drawing Sheets

(51) Int. Cl.
*H01L 23/36* (2006.01)
*H01L 23/367* (2006.01)
*H01L 23/498* (2006.01)
*H01L 23/433* (2006.01)
*H01L 23/00* (2006.01)

(56) References Cited

U.S. PATENT DOCUMENTS

| | | |
|---|---|---|
| 6,954,360 B2 | 10/2005 | Nurminen |
| 7,109,573 B2 | 9/2006 | Nurminen |
| 7,190,056 B2 | 3/2007 | Nurminen |
| 7,405,106 B2 | 7/2008 | Maloney et al. |
| 8,021,907 B2 | 9/2011 | Pagaila et al. |
| 2003/0006055 A1 | 1/2003 | Chien-Hung et al. |
| 2004/0253767 A1* | 12/2004 | Nurminen .................. 438/125 |
| 2010/0001384 A1 | 1/2010 | Bathan et al. |

OTHER PUBLICATIONS

U.S. Appl. No. 13/102,041, filed May 5, 2011, Do et al.

* cited by examiner

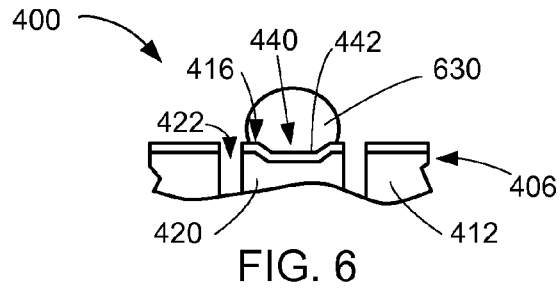
FIG. 6
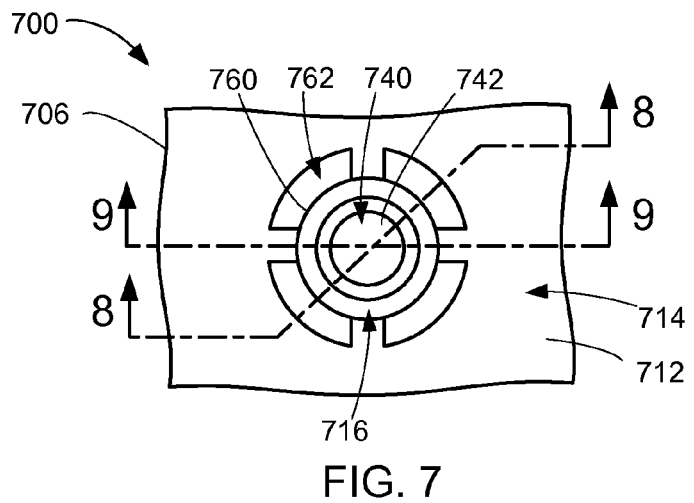
FIG. 7
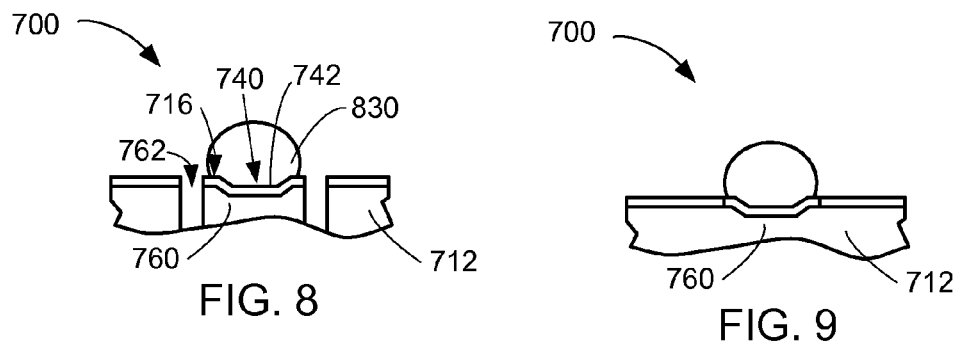
FIG. 8
FIG. 9
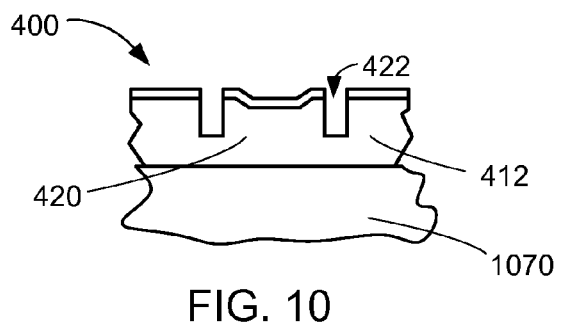
FIG. 10

INTEGRATED CIRCUIT PACKAGING SYSTEM WITH THERMAL STRUCTURES AND METHOD OF MANUFACTURE THEREOF

CROSS-REFERENCE TO RELATED APPLICATION

This application claims the benefit of U.S. Provisional Patent Application Ser. No. 61/545,081 filed Oct. 7, 2011, and the subject matter thereof is incorporated herein by reference thereto.

TECHNICAL FIELD

The present invention relates generally to an integrated circuit packaging system, and more particularly to a system with thermal structures.

BACKGROUND ART

Electronic products have become an integral part of our daily lives. This has created a consistent if not increasing expectation for new features, higher speed, more data, improved portability, etc. These demands have driven the development of electronic technology to reduce size, improve utility, and increase performance of the integrated circuit devices in an ever-increasing range of products such as cell phones, music players, televisions, and automobiles.

Packages of components such as semiconductor circuits, transistors, diodes, and other electronic devices must also become smaller and thinner with more functions and connections. As the size of connections decreases and density increases, heat dissipation becomes an issue.

Thus, a need still remains for packages with increased thermal performance. In view of the decreasing size of connectors, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: forming a thermal attach cluster includes: forming a heat collector having a heat dissipation surface, forming a cluster bridge, having a thermal surface, connected to the heat collector, forming a cluster pad, having an attachment surface, connected to the end of the cluster bridge opposite the heat collector; connecting an integrated circuit to the thermal attach cluster; and forming an encapsulation over the thermal attach cluster with the heat dissipation surface, the thermal surface, and the attachment surface exposed from and coplanar with the encapsulation.

The present invention provides an integrated circuit packaging system, including: a thermal attach cluster including: a heat collector having a heat dissipation surface, a cluster bridge, having a thermal surface, connected to the heat collector, a cluster pad, having an attachment surface, connected to the end of the cluster bridge opposite the heat collector; an integrated circuit connected to the thermal attach cluster; and an encapsulation over the thermal attach cluster, the heat dissipation surface, the thermal surface, and the attachment surface exposed from and coplanar with the encapsulation.

Certain embodiments of the invention have other steps or elements in addition to or in place of those mentioned above. The steps or elements will become apparent to those skilled in the art from a reading of the following detailed description when taken with reference to the accompanying drawings.

BRIEF DESCRIPTION OF THE DRAWINGS

FIG. 6 is a cross-sectional view of the portion of the thermal attach clusters of the integrated circuit packaging system along line 6-6 of FIG. 5.

FIG. 7 is a top view of a portion of thermal attach clusters of an integrated circuit packaging system in a third embodiment of the present invention.

FIG. 8 is a cross-sectional view of the integrated circuit packaging system along line 8-8 of FIG. 7.

FIG. 9 is a cross-sectional view of the integrated circuit packaging system along line 9-9 of FIG. 7.

FIG. 10 is a cross-sectional view of a portion of the integrated circuit packaging system 400 along line 6-6 of FIG. 5 in a removal phase.

BEST MODE FOR CARRYING OUT THE INVENTION

Figure 1:
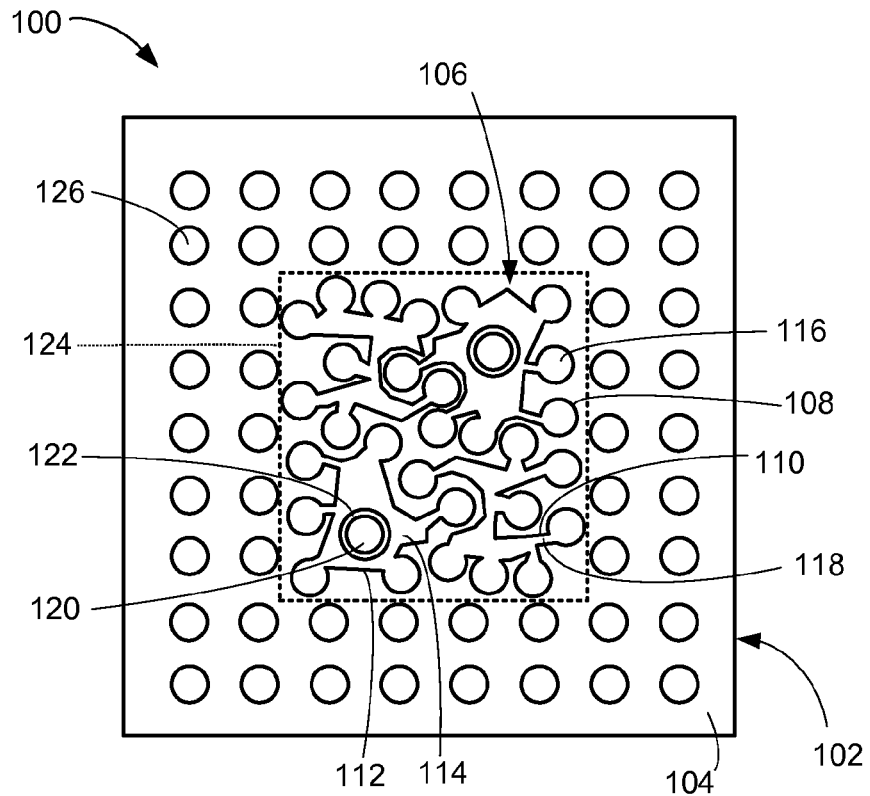
FIG. 1 is a bottom view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to a plane parallel to the "active side" of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements.

The term "processing" as used herein includes deposition of material or photoresist, patterning, exposure, development, etching, cleaning, and/or removal of the material or photoresist as required in forming a described structure.

Referring now to FIG. 1, therein is shown a bottom view of an integrated circuit packaging system 100 in a first embodiment of the present invention. The bottom view depicts the integrated circuit packaging system 100 having an encapsulation bottom side 102 of an encapsulation 104. The encapsulation 104 is defined as a protective package cover of a semiconductor package to hermetically seal a semiconductor device and package components for providing mechanical and environmental protection. As an example, the encapsulation 104 can be a polymer, such as an epoxy molding compound, a composite material, a ceramic material, or any other material capable of being formed to provide mechanical and environmental protection.

The encapsulation bottom side 102 is defined as the side or surface facing a mounting structure (not shown). For example, the mounting structure can be the next system level down, such as a stacking or mounting surface of a substrate or printed circuit board.

The integrated circuit packaging system 100 can include thermal attach clusters 106. The thermal attach clusters 106 are defined as a network of conductive elements exposed from a protective cover for enhanced dissipation of thermal energy. For example, the thermal attach clusters 106 can be a network of a non-mounting thermal structure surrounded by and connected to conductive pads.

The thermal attach clusters 106 can be exposed from the encapsulation 104 along the encapsulation bottom side 102. The thermal attach clusters 106 can include cluster pads 108, cluster bridges 110, and a heat collector 112.

The heat collector 112 is defined as a thermally conductive structure having at least one surface dedicated to dissipation of thermal energy. The heat collector 112 can be formed from an electrically and thermally conductive material, such as a metal or metal alloy, including copper, tin, zinc, a copper alloy, or other alloys.

The heat collector 112 can have a heat dissipation surface 114. The heat dissipation surface 114 is defined as a surface dedicated to dissipation of thermal energy. The heat dissipation surface 114 can be the portion of the heat collector 112 that is exposed from the encapsulation bottom side 102. The heat dissipation surface 114 can be coplanar with the encapsulation bottom side 102. The heat collector 112 can function to effectively radiate heat from the integrated circuit packaging system 100 through the heat dissipation surface 114.

The heat dissipation surface 114 is not for attaching of connective or mounting structures, such as solder balls, solder bumps, conductive bumps, or conductive pillars. The heat dissipation surface 114 is not covered or obscured by direct attachment of connecting structures, such as solder balls, solder bumps, conductive bumps, or conductive pillars. Further, the heat dissipation surface 114 is not obscured by a covering or protective layer, such as a solder mask, a polymer film, an insulating film or cover, or any other cover that would reduce or prevent thermal conductivity.

The heat collector 112 can take various shapes. For example, the heat collector can be irregularly shaped or shaped like a rectangle, trapezoid, circle, or other geometric shape. As a further example, the heat collector 112 can have a shape that fills the space between the cluster pads 108.

In yet a further example, the heat collector 112 can have a shape that maximizes the heat dissipation surface 114 and connects to groups of the cluster pads 108. As a specific example, the heat collector can have increased horizontal dimension relative to the cluster bridges 110. The horizontal dimension can be along a two dimensional horizontal plane as defined by the surface of the encapsulation bottom side 102.

The cluster pads 108 can be connected to the heat collector 112 with the cluster bridges 110. The cluster pads 108 are defined as pads for attaching or placing connecting structures. Connecting structures can include, for example, such as solder balls, solder bumps, conductive bumps, or conductive pillars. The cluster pads 108 can be formed from an electrically and thermally conductive material, such as a metal or metal alloy, including copper, tin, zinc, a copper alloy, other alloys, or a material similar to that used to form the heat collector 112.

The cluster pads 108 can have an attachment surface 116. The attachment surface 116 can be the portion of the cluster pads 108 that is exposed from the encapsulation bottom side 102. The attachment surface 116 can be coplanar with the encapsulation bottom side 102, the heat dissipation surface 114, or a combination thereof.

The cluster pads 108 can be arranged around the heat collector 112. A group of one or more of the cluster pads 108 can be attached to the heat collector 112 in one of the thermal attach clusters 106. The heat collector 112 and the cluster pads 108 are physically separate elements and can be connected with the cluster bridges 110.

For illustrative purposes, the cluster pads 108 can be arranged in an irregular configuration. For example, the irregular configuration can be a configuration that does not have a repeating or regular pattern, such as a row or an array configuration. As a further example, a group of the cluster pads 108 that are attached to the heat collector 112 can be grouped or arranged according to routing or connection requirements for the integrated circuit packaging system 100, such as separate ground or signal connections.

The cluster bridges 110 are defined as embedded conductive traces having at least one surface exposed from a protective cover. The cluster bridges 110 can be formed from an electrically and thermally conductive material, such as a metal or metal alloy, including copper, tin, zinc, a copper alloy, other alloys, or a material similar to that used to form the heat collector 112, the cluster pads 108, or a combination thereof.

The cluster bridges 110 can extend away from the heat collector 112. The cluster pads 108 can be connected at an end of the cluster bridges 110 opposite the heat collector 112.

The cluster bridges 110 can have a thermal surface 118. The thermal surface 118 can be the portion of the cluster bridges 110 that is exposed from the encapsulation bottom side 102. The thermal surface 118 can be coplanar with the encapsulation bottom side 102 of the encapsulation 104, the heat dissipation surface 114 of the heat collector 112, the attachment surface 116 of the cluster pads 108, or a combination thereof. The thermal surface 118 can have a horizontal dimension that is less than that of the attachment surface 116 and the heat dissipation surface 114. The thermal surface 118 can have a surface area that is less than that of both the attachment surface 116 and the heat dissipation surface 114.

The cluster bridges 110 can be selectively cut or removed to physically and electrically separate one or more of the cluster pads 108 from one of the thermal attach clusters 106, the heat collector 112, or a combination thereof. For example, if one of the thermal attach clusters 106 functions as a path to ground, one of the cluster pads 108 can be separated by severing one of the cluster bridges 110 to shield one of the cluster pads 108 from interference due to the ground connection from the heat collector 112 or others of the cluster pads 108 attached to the heat collector 112.

The thermal attach clusters 106 can include an isolation pad 120 surrounded by the heat collector 112. The isolation pad 120 is defined as a pad for attaching or placing connecting or interconnect structures. The isolation pad 120 can be completely surrounded by and physically isolated from the heat collector 112. For example, the attachment surface 116 can be surrounded by the heat dissipation surface 114 of the heat collector 112 with an isolation groove 122 in between. The isolation pad 120 can provide signal routing that is different from the signal transmitted through the heat collector 112 surrounding the isolation pad 120. The isolation pad 120 can be optional.

The integrated circuit packaging system 100 can include an integrated circuit 124 connected to the thermal attach clusters 106. The integrated circuit 124 is defined as a semiconductor device having active circuitry therein. The integrated circuit 124 is represented by the hidden lines of the dashed square.

The integrated circuit packaging system 100 can include one or more of the thermal attach clusters 106 exposed from the encapsulation bottom side 102. The thermal attach clusters 106 can be at an inner or a central region of the encapsulation bottom side 102. The thermal attach clusters 106 can preferably be located in a region of the encapsulation bottom side 102 corresponding to the location of the integrated circuit 124. For example, the thermal attach clusters 106 can be located directly below the area or region that the integrated circuit 124 is mounted. As a further example, the thermal attach clusters 106 are non-continuous structures that do not attach or connect to one another.

The thermal attach clusters 106 can be surrounded by terminal pads 126. The terminal pads 126 can be exposed from the encapsulation bottom side 102. The terminal pads 126 are not connected to the thermal attach clusters 106.

For illustrative purposes, dual rows of the terminal pads 126 are arranged in an array configuration along the perimeter of the encapsulation bottom side 102, although it is understood that the terminal pads 126 can be arranged in a different configuration in a different number of rows. For example, the terminal pads 126 can be arranged in a staggered configuration or can include more or less than two rows.

It has been discovered that the thermal attach clusters 106 improves the thermal characteristics of the integrated circuit packaging system 100. For example, because the thermal attach clusters 106 include the heat collector 112 as an exposed structural element, the thermal attach clusters 106 provide a larger surface area to dissipate heat than with the cluster pads 108 and the terminal pads 126 alone.

It has also been discovered that the thermal attach clusters 106 having more than one of the cluster pads 108 surrounding and connected to the heat collector 112 provides more options and possibilities for routing. For example, the cluster pads 108 can be formed in a tight or compact configuration allowing more space for routing while maintaining the surface area necessary for improved thermal or heat transfer for the integrated circuit packaging system 100.

It has further been discovered that cutting or removing the cluster bridges 110 and isolating one of the cluster pads 108 from the heat collector 112 can effectively shield the isolated one of the cluster pads 108 from interference of the thermal attach clusters 106.

It has yet further been discovered that the isolation pad 120 can provide increased routing and signal paths. For example, the isolation pad 120 can be effectively shield from the cluster pads 108 to function as a signal path that is different from the thermal attach clusters 106 surrounding the isolation pad 120, which increases the routing and signal path options.

It has yet further been discovered that the thermal attach cluster can provide improved board level reliability (BLR). The improvement in BLR is caused by the reduction in operating temperature, which can have a significant impact on the operational life by increasing the functional duration of the integrated circuit packaging system 100.

Figure 2:
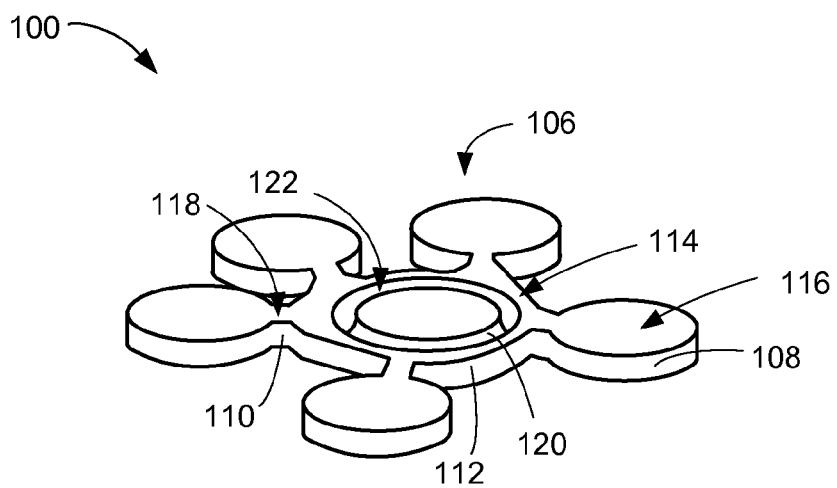
FIG. 2 is an isometric view of an example of the thermal attach clusters of the integrated circuit packaging system of FIG. 1.

Referring now to FIG. 2, therein is shown an isometric view of an example of the thermal attach clusters 106 of the integrated circuit packaging system of FIG. 1. The isometric view depicts one of the thermal attach clusters 106 having the cluster pads 108 connected to and surrounding the heat collector 112.

The isolation pad 120 is within the heat collector 112. The isolation groove 122 can completely isolate the isolation pad 120 from the heat collector 112.

The attachment surface 116 of each of the cluster pads 108 and the isolation pad 120, the heat dissipation surface 114, and the thermal surface 118 of the cluster bridges 110 can be coplanar with one another. The thermal surface 118 can have a surface area that is less than the surface area of both the cluster pads 108 and the heat dissipation surface 114.

Figure 3:
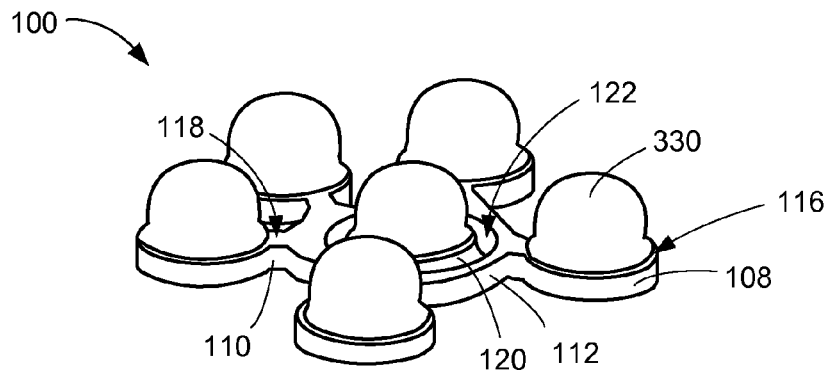
FIG. 3 is the thermal attach clusters of FIG. 2.

Referring now to FIG. 3, therein is shown the thermal attach clusters 106 of FIG. 2. External interconnects 330 can be attached to the attachment surface 116 of the cluster pads 108. The external interconnects 330 are defined as a conductive structure for providing electrical and physical connection between structures or components. The external interconnects 330 can provide electrical and physical connection between the integrated circuit packaging system 100 and a next system level down (not shown). Similarly, the external interconnects 330 can be attached to the attachment surface 116 of the isolation pad 120.

It has been discovered that the physical separation between the cluster pads 108 and the heat collector 112 provided by the cluster bridges 110 can facilitate placement of the external interconnects 330. For example, the relatively low surface area of the thermal surface 118 of the cluster bridges 110 can confine flow of the external interconnects 330 to the attachment surface 116 when attaching the external interconnects 330 to the cluster pads 108.

It has further been discovered that the physical separation between the isolation pad 120 and the heat collector 112 provided by the isolation groove 122 can facilitate placement of the external interconnects 330. For example, the isolation groove 122 can confine flow of the external interconnects 330 to the attachment surface 116 when attaching the external interconnects 330 to the isolation pad 120.

Figure 4:
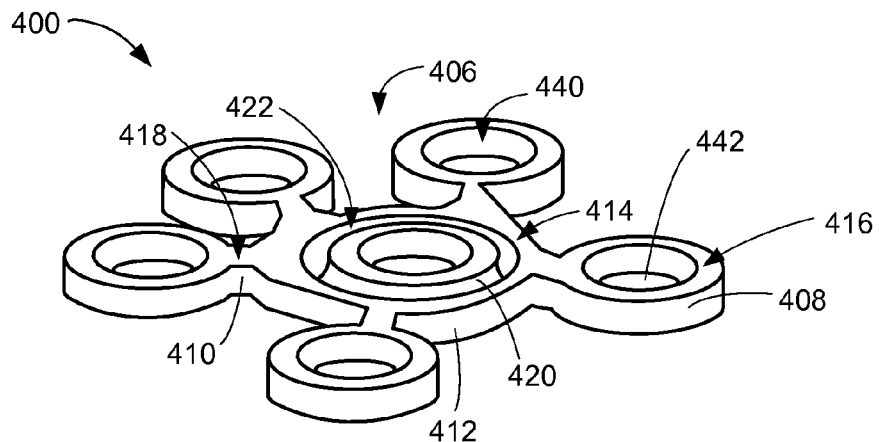
FIG. 4 is an isometric view of an example of a thermal attach clusters of an integrated circuit packaging system in a second embodiment of the present invention.

Referring now to FIG. 4, therein is shown an isometric view of an example of a thermal attach clusters 406 of an integrated circuit packaging system 400 in a second embodiment of the present invention. The thermal attach clusters 406 are defined as a network of conductive elements exposed from a protective cover for enhanced dissipation of thermal energy. For example, the thermal attach clusters 406 can be a network of a non-mounting thermal structure surrounded by and connected to conductive pads. The thermal attach clusters 406 can include cluster pads 408, cluster bridges 410, and a heat collector 412.

The heat collector 412 is defined as a thermally conductive structure having at least one surface dedicated to dissipation of thermal energy. The heat collector 412 can be formed from an electrically and thermally conductive material, such as a metal or metal alloy, including copper, tin, zinc, a copper alloy, or other alloys.

The heat collector 412 can have a heat dissipation surface 414. The heat dissipation surface 414 is defined as a surface dedicated to dissipation of thermal energy. The heat collector 412 can function to effectively radiate heat from the integrated circuit packaging system 400 through the heat dissipation surface 414.

The heat dissipation surface 414 is not for attaching of connective or mounting structures, such as solder balls, solder bumps, conductive bumps, or conductive pillars. The heat dissipation surface 414 is not covered or obscured by direct attachment of connecting structures, such as solder balls, solder bumps, conductive bumps, or conductive pillars. Further, the heat dissipation surface 414 is not obscured by a covering or protective layer, such as a solder mask, a polymer film, an insulating film or cover, or any other cover that would reduce or prevent thermal conductivity.

The heat collector 412 can take various shapes. For example, the heat collector can be irregularly shaped or shaped like a rectangle, trapezoid, circle, or other geometric shape. As a further example, the heat collector 412 can have a shape that fills the space between the cluster pads 408.

In yet a further example, the heat collector 412 can have a shape that maximizes the heat dissipation surface 414 and connects to groups of the cluster pads 408. As a specific example, the heat collector can have increased horizontal dimension relative to the cluster bridges 410.

The cluster pads 408 can be connected to the heat collector 412 with the cluster bridges 410. The cluster pads 408 are defined as pads for attaching or placing connecting structures. Connecting structures can include, for example, such as solder balls, solder bumps, conductive bumps, or conductive pillars. The cluster pads 408 can be formed from an electrically and thermally conductive material, such as a metal or metal alloy, including copper, tin, zinc, a copper alloy, other alloys, or a material similar to that used to form the heat collector 412.

The cluster pads 408 can have an attachment surface 416. The attachment surface 416 can be coplanar with the heat dissipation surface 414. The attachment surface 416 can include a mounting recess 440.

The mounting recess 440 is defined as a recessed surface for facilitating attachment of interconnect structures. For example, the mounting recess 440 can be a ball drop surface for attachment interconnect structures, such as solder balls, solder bumps, conductive bumps, conductive posts, or conductive pillars. The mounting recess 440 can have a recessed surface 442 that is offset from the attachment surface 416.

The cluster pads 408 can be arranged around the heat collector 412. A group of one or more of the cluster pads 408 can be attached to the heat collector 412 in one of the thermal attach clusters 406. The heat collector 412 and the cluster pads 408 are physically separate elements and can be connected with the cluster bridges 410.

For illustrative purposes, the cluster pads 408 can be arranged in an irregular configuration. For example, the irregular configuration can be a configuration that does not have a repeating or regular pattern, such as a row or an array configuration. As a further example, a group of the cluster pads 408 that are attached to the heat collector 412 can be grouped or arranged according to routing or connection requirements for the integrated circuit packaging system 400, such as separate grounding connections.

The cluster bridges 410 are defined as embedded conductive traces having at least one surface exposed from a protective cover. The cluster bridges 410 can be formed from an electrically and thermally conductive material, such as a metal or metal alloy, including copper, tin, zinc, a copper alloy, other alloys, or a material similar to that used to form the heat collector 412, the cluster pads 408, or a combination thereof.

The cluster bridges 410 can extend away from the heat collector 412. The cluster pads 408 can be connected at an end of the cluster bridges 410 opposite the heat collector 412.

The cluster bridges 410 can have a thermal surface 418. The thermal surface 418 can be coplanar with the heat dissipation surface 414 of the heat collector 412, the attachment surface 416 of the cluster pads 408, or a combination thereof. The thermal surface 418 can have a horizontal dimension that is less than that of the attachment surface 416 and the heat dissipation surface 414. The thermal surface 418 can have a surface area that is less than that of both the attachment surface 416 and the heat dissipation surface 414.

The cluster bridges 410 can be selectively cut or removed to physically and electrically separate one or more of the cluster pads 408. For example, if one of the thermal attach clusters 406 functions as a path to ground, one of the cluster pads 408 can be separated by severing one of the cluster bridges 410 to shield one of the cluster pads 408 from interference due to the ground connection from the heat collector 412 or others of the cluster pads 408 attached to the heat collector 412.

The thermal attach clusters 406 can include an isolation pad 420 surrounded by the heat collector 412. The isolation pad 420 is defined as pads for attaching or placing connecting structures. The isolation pad 420 can be completely surrounded by and physically isolated from the heat collector 412. For example, the attachment surface 416 can be surrounded by the heat dissipation surface 414 of the heat collector 412 with an isolation groove 422 in between. The isolation pad 420 can provide signal routing that is different from the signal transmitted through the heat collector 412 surrounding the isolation pad 420. The isolation pad 420 can be optional.

It has been discovered that the thermal attach clusters 406 improves the thermal characteristics of the integrated circuit packaging system 400. For example, because the thermal attach clusters 406 include the heat collector 412 as an exposed structural element, the thermal attach clusters 406 provide a larger surface area to dissipate heat than with the cluster pads 408 alone.

It has also been discovered that the thermal attach clusters 406 having more than one of the cluster pads 408 surrounding and connected to the heat collector 412 provides more options and possibilities for routing. For example, the cluster pads 408 can be formed in a tight or compact configuration allowing more space for routing while maintaining the surface area necessary for improved thermal or heat transfer for the integrated circuit packaging system 400.

It has further been discovered that cutting or removing the cluster bridges 410 and isolating one of the cluster pads 408 from the heat collector 412 can effectively shield the isolated one of the cluster pads 408 from interference of the thermal attach clusters 406.

It has yet further been discovered that the isolation pad 420 can provide increased routing and signal paths. For example, the isolation pad 420 can be effectively shield from the cluster pads 408 to function as a signal path that is different from the thermal attach clusters 406 surrounding the isolation pad 420, which increases the routing and signal path options.

It has yet further been discovered that the thermal attach clusters 406 can provide improved board level reliability (BLR). The improvement in BLR is caused by the reduction in operating temperature, which can have a significant impact on the operational life by increasing the functional duration of the integrated circuit packaging system 400.

It has yet further been discovered that the mounting recess 440 can facilitate placement of a connective or mounting structures by confining flow of the connective structure to the mounting recess 440.

Figure 5:
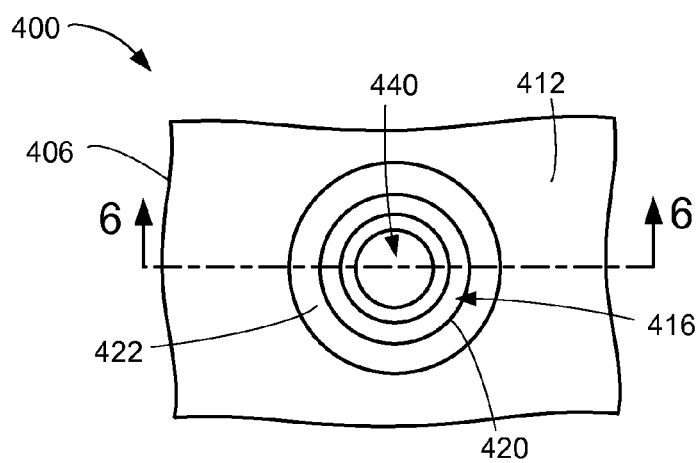
FIG. 5 is a top view of a portion of the thermal attach clusters of the integrated circuit packaging system of FIG. 4.

Referring now to FIG. 5, therein is shown a top view of a portion of the thermal attach clusters 406 of the integrated circuit packaging system 400 of FIG. 4. The top view depicts the heat collector 412 having the isolation pad 420 with the mounting recess 440. The mounting recess 440 can be at a center portion of the attachment surface 416. The mounting recess 440 can be concentric with the attachment surface 416.

The isolation pad 420 can be surrounded by the isolation groove 422. The isolation groove 422 can physically separate the isolation pad 420 from the heat collector 412.

Referring now to FIG. 6, therein is shown a cross-sectional view of the portion of the thermal attach clusters 406 of the integrated circuit packaging system 400 along line 6-6 of FIG. 5. The cross-sectional view depicts the heat collector 412 having the isolation pad 420 with the mounting recess 440. The mounting recess 440 can be at a center portion of the attachment surface 416. The mounting recess 440 can have a recessed surface 442 that is offset from the attachment surface 416. The isolation pad 420 can be surrounded by the isolation groove 422. The isolation groove 422 can physically separate the isolation pad 420 from the heat collector 412.

External interconnects 630 can be attached to the isolation pad 420. The external interconnects 630 are defined as a conductive structure for providing electrical and physical connection between structures or components. The external interconnects 630 can provide electrical and physical connection between the integrated circuit packaging system 400 and a next system level down (not shown).

The external interconnects 630 can be fill the mounting recess 440 and attached to the attachment surface 416 of the isolation pad 420. The external interconnects 630 are not in the isolation groove 422.

Referring now to FIG. 7, therein is shown a top view of a portion of thermal attach clusters 706 of an integrated circuit packaging system 700 in a third embodiment of the present invention. The thermal attach clusters 706 are defined as a network of conductive elements exposed from a protective cover for enhanced dissipation of thermal energy. For example, the thermal attach clusters 706 can be a network of a non-mounting thermal structure surrounded by and connected to conductive pads. The thermal attach clusters 706 can include a heat collector 712 and a heat collector pad 760.

The heat collector 712 is defined as a thermally conductive structure having at least one surface dedicated to dissipation of thermal energy. The heat collector 712 can be formed from an electrically and thermally conductive material, such as a metal or metal alloy, including copper, tin, zinc, a copper alloy, or other alloys.

The heat collector 712 can have a heat dissipation surface 714. The heat dissipation surface 714 is defined as a surface dedicated to dissipation of thermal energy. The heat dissipation surface 714 can be the portion of the heat collector 712 that can be exposed from a bottom surface of a protective cover, such as the encapsulation bottom side 102 of FIG. 1. The heat dissipation surface 714 can be coplanar with bottom surface of the protective cover. The heat collector 712 can function to effectively radiate heat from the integrated circuit packaging system 700 through the heat dissipation surface 714.

The heat dissipation surface 714 is not for attaching of connective or mounting structures, such as solder balls, solder bumps, conductive bumps, or conductive pillars. The heat dissipation surface 714 is not covered or obscured by direct attachment of connecting structures, such as solder balls, solder bumps, conductive bumps, or conductive pillars. Further, the heat dissipation surface 714 is not obscured by a covering or protective layer, such as a solder mask, a polymer film, an insulating film or cover, or any other cover that would reduce or prevent thermal conductivity.

The heat collector pad 760 is defined as pads for attaching or placing interconnect structures. Interconnect structures can include, for example, such as solder balls, solder bumps, conductive bumps, conductive posts, or conductive pillars.

The heat collector pad 760 can be partially surrounded by selective peripheral grooves 762. The selective peripheral grooves 762 are defined as grooves or gaps to define a mounting area along a surface. The selective peripheral grooves 762 can provide partial physical separation between portions of the heat collector pad 760 from the heat collector 712. The physical separation can define an area on the heat collector 712 for attaching or mounting interconnect structures.

The top view depicts the heat collector 712 having the heat collector pad 760 with a mounting recess 740. The mounting recess 740 is defined as a recessed surface for facilitating attachment of interconnect structures. The mounting recess 740 can be at a center portion of an attachment surface 716 of the heat collector pad 760. The mounting recess 740 can be concentric with the attachment surface 716. The mounting recess 740 can have a recessed surface 742 that is offset from the attachment surface 716.

It has been discovered that the heat collector pad 760 increases connectivity of the integrated circuit packaging system 700. The heat collector pad 760 increases connectivity by providing additional sites for attaching interconnect structures along the heat dissipation surface 714, which is not for attaching interconnect structures.

Referring now to FIG. 8, therein is shown a cross-sectional view of the integrated circuit packaging system 700 along line 8-8 of FIG. 7. The cross-sectional view depicts the heat collector 712 having the heat collector pad 760 with the selective peripheral grooves 762. The mounting recess 740 can be at a center portion of the attachment surface 716. The mounting recess 740 have a recessed surface 742 that is offset from the attachment surface 716. The selective peripheral grooves 762 can provide physically separation between the heat collector pad 760 and the heat collector 712.

External interconnects 830 can be attached to the heat collector pad 760. The external interconnects 830 are defined as a conductive structure for providing electrical and physical connection between structures or components. The external interconnects 830 can provide electrical and physical connection between the integrated circuit packaging system 700 and a next system level down (not shown).

The external interconnects 830 can be fill the mounting recess 740 and attached to the attachment surface 716 of the heat collector pad 760. The external interconnects 830 are not in the selective peripheral grooves 762.

It has been discovered that the physical separation between the heat collector pad 760 and the heat collector 712 provided by the selective peripheral grooves 762 can facilitate placement of the external interconnects 830. For example, the selective peripheral grooves 762 can confine flow of the external interconnects 830 to the attachment surface 716 when attaching the external interconnects 830 to the heat collector pad 760.

Referring now to FIG. 9, therein is shown a cross-sectional view of the integrated circuit packaging system 700 along line 9-9 of FIG. 7. The cross-sectional view depicts the portion of the heat collector pad 760 that is connected to the heat collector 712. The connection between the heat collector pad 760 and the heat collector 712 enables the both the heat collector pad 760 and the heat collector 712 to carry the same signal.

Referring now to FIG. 10, therein is shown a cross-sectional view of a portion of the integrated circuit packaging system 400 along line 6-6 of FIG. 5 in a removal phase. The cross-sectional view depicts the heat collector 412 partially attached to the isolation pad 420 with a lead frame 1070. The portion of the lead frame 1070 can be removed to form a partial separation between the heat collector 412 and the isolation pad 420.

The portion of the lead frame 1070 connecting the isolation pad 420 and the heat collector 412 can be removed to form the isolation groove 422 of FIG. 5. The portion of the lead frame 1070 can be removed by a number of different methods, such as chemical etching, laser ablation, or sawing.

Figure 11:
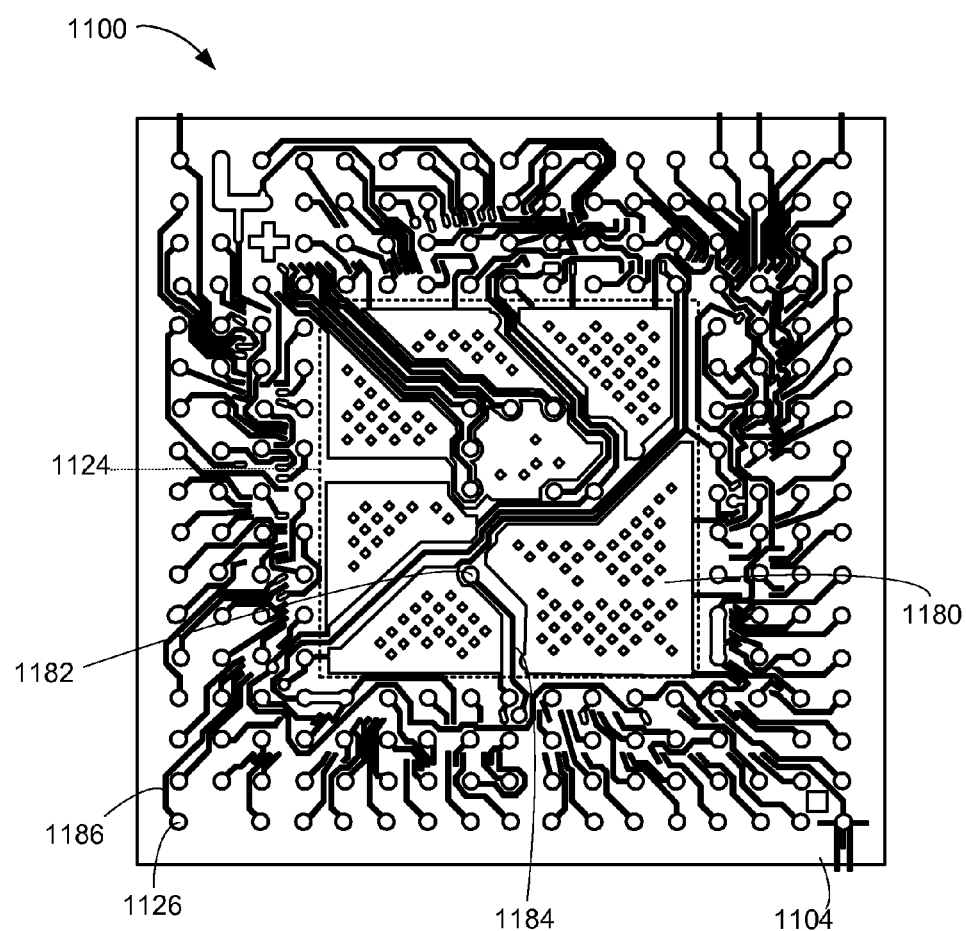
FIG. 11 is a top plan view of an integrated circuit packaging system in a fourth embodiment of the present invention.

Referring now to FIG. 11, therein is shown a top plan view of an integrated circuit packaging system 1100 in a fourth embodiment of the present invention. The top plan view depicts an encapsulation 1104. The encapsulation 1104 is defined as a protective package cover of a semiconductor package to hermetically seal a semiconductor device and package components for providing mechanical and environmental protection. As an example, the encapsulation 1104 can be a polymer, such as an epoxy molding compound, a composite material, a ceramic material, or any other material capable of being formed to provide mechanical and environmental protection.

Thermal pads 1180 can be embedded in the encapsulation 1104. The thermal pads 1180 are thermally and electrically conductive structures that support signals within a packaging system. For example the thermal pads 1180 can provide different and separate ground paths. The integrated circuit packaging system 1100 can include one or more separate ones of the thermal pads 1180 that can be electrically and physically isolated from each other.

The integrated circuit packaging system 1100 can include an integrated circuit 1124 connected to the thermal pads 1180. The integrated circuit 1124 is defined as a semiconductor device having active circuitry therein. The integrated circuit 1124 is represented by the hidden lines of the dashed square.

The thermal pads 1180 can preferably be located at a central or inner portion of the integrated circuit packaging system 1100. The thermal pads 1180 can correspond to the location of the integrated circuit 1124 of the integrated circuit packaging system 1100. For example, the die mount region can be the area or region where an integrated circuit can be mounted or attached.

Ground pads 1182 can be between the thermal pads 1180. The ground pads 1182 are defined as pads for attaching or placing connecting structures. Connecting structures can include, for example, such as solder balls, solder bumps, conductive bumps, or conductive pillars. The ground pads 1182 can be connected to ground traces 1184. The ground traces 1184 are defined as embedded conductive paths for connection to ground.

The thermal pads 1180 can be surrounded by terminal pads 1126. For illustrative purposes, dual rows of the terminal pads 1126 are arranged in an array configuration along the perimeter of the integrated circuit packaging system 1100, although it is understood that the terminal pads 1126 can be arranged in a different configuration in a different number of rows. For example, the terminal pads 1126 can be arranged in a staggered configuration or can include more or less than two rows.

The terminal pads 1126 can be connected to terminal traces 1186. The terminal traces 1186 are for providing electrical connectivity to other components or devices within the integrated circuit packaging system 1100. For example, the terminal traces 1186 can connect the terminal pads 1126 to an integrated circuit, other circuit devices, or passive devices.

Figure 12:
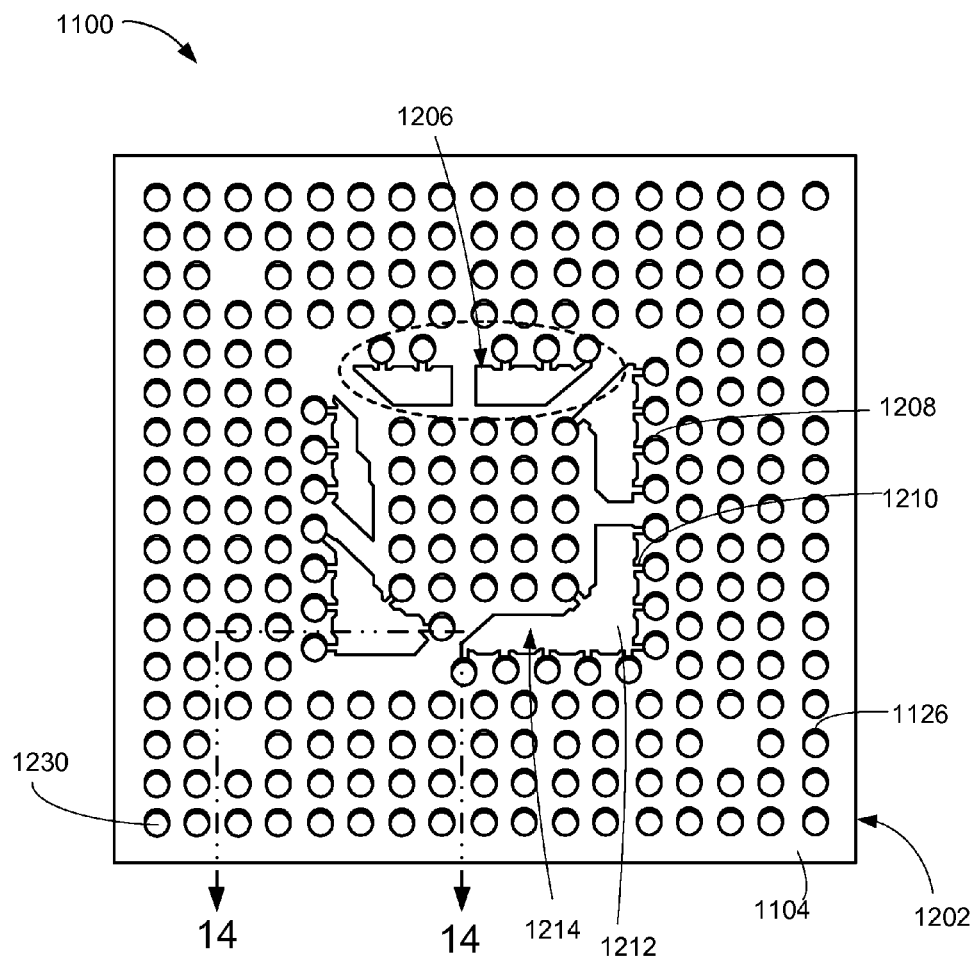
FIG. 12 is a bottom view of the integrated circuit packaging system.

Referring now to FIG. 12, therein is shown a bottom view of the integrated circuit packaging system 1100. The bottom view depicts an encapsulation bottom side 1202 of the encapsulation 1104. The encapsulation bottom side 1202 is defined as the side or surface facing a mounting structure (not shown). For example, the mounting structure can be the next system level down, such as a stacking or mounting surface of a substrate or printed circuit board.

The integrated circuit packaging system 1100 can include thermal attach clusters 1206. The thermal attach clusters 1206 are defined as a network of conductive elements exposed from a protective cover for enhanced dissipation of thermal energy. For example, the thermal attach clusters 1206 can be a network of a non-mounting thermal structure surrounded by and connected to conductive pads. The integrated circuit 1124 of FIG. 11 can be connected to the thermal attach clusters 1206.

The thermal attach clusters 1206 can be exposed from the encapsulation 1104 along the encapsulation bottom side 1202. The thermal attach clusters 1206 can include cluster pads 1208, cluster bridges 1210, and a heat collector 1212.

The heat collector 1212 is defined as a thermally conductive structure having at least one surface dedicated to dissipation of thermal energy. The heat collector 1212 can be formed from an electrically and thermally conductive material, such as a metal or metal alloy, including copper, tin, zinc, a copper alloy, or other alloys. The heat collector 1212 can be an exposed portion of the thermal pads 1180 of FIG. 11.

The heat collector 1212 can have a heat dissipation surface 1214. The heat dissipation surface 1214 is defined as a surface dedicated to dissipation of thermal energy. The heat dissipation surface 1214 can be the portion of the heat collector 1212 that is exposed from the encapsulation bottom side 1202. The heat dissipation surface 1214 can be coplanar with the encapsulation bottom side 1202. The heat collector 1212 can function to effectively radiate heat from the integrated circuit packaging system 1100 through the heat dissipation surface 1214.

The heat dissipation surface 1214 is not for attaching of connective or mounting structures, such as solder balls, solder bumps, conductive bumps, or conductive pillars. The heat dissipation surface 1214 is not covered or obscured by direct attachment of connecting structures, such as solder balls, solder bumps, conductive bumps, or conductive pillars. Further, the heat dissipation surface 1214 is not obscured by a covering or protective layer, such as a solder mask, a polymer film, an insulating film or cover, or any other cover that would reduce or prevent thermal conductivity.

The heat collector 1212 can take various shapes. For example, the heat collector can be irregularly shaped or shaped like a rectangle, trapezoid, circle, or other geometric shape. As a further example, the heat collector 1212 can have a shape that fills the space between the cluster pads 1208.

In yet a further example, the heat collector 1212 can have a shape that maximizes the heat dissipation surface 1214 and connects to groups of the cluster pads 1208. As a specific example, the heat collector can have increased horizontal dimension relative to the cluster bridges 1210. The horizontal dimension can be along a two dimensional horizontal plane as defined by the surface of the encapsulation bottom side 1202.

The cluster pads 1208 can be connected to the heat collector 1212 with the cluster bridges 1210. The cluster pads 1208 can be formed from an electrically and thermally conductive material, such as a metal or metal alloy, including copper, tin, zinc, a copper alloy, other alloys, or a material similar to that used to form the heat collector 1212.

The cluster pads 1208 can be arranged around the heat collector 1212. A group of one or more of the cluster pads 1208 can be attached to the heat collector 1212 in one of the thermal attach clusters 1206. The heat collector 1212 and the cluster pads 1208 are physically separate elements and can be connected with the cluster bridges 1210. As an example, a group of the cluster pads 1208 that are attached to the heat collector 1212 can be grouped or arranged according to routing or connection requirements for the integrated circuit packaging system 1100, such as separate grounding connections.

The cluster bridges 1210 are defined as embedded conductive traces having at least one surface exposed from a protective cover. The cluster bridges 1210 can be formed from an electrically and thermally conductive material, such as a metal or metal alloy, including copper, tin, zinc, a copper alloy, other alloys, or a material similar to that used to form the heat collector 1212, the cluster pads 1208, or a combination thereof.

The cluster bridges 1210 can extend away from the heat collector 1212. The cluster pads 1208 can be connected at an end of the cluster bridges 1210 opposite the heat collector 1212.

The cluster bridges 1210 can be selectively cut or removed to physically and electrically separate one or more of the cluster pads 1208. For example, if one of the thermal attach clusters 1206 functions as a path to ground, one of the cluster pads 1208 can be shielded from interference due to the ground connection from the heat collector 1212 or the cluster pads 1208 attached to the heat collector 1212.

The thermal attach clusters 1206 can be at an inner or a central region of the encapsulation bottom side 1202. The thermal attach clusters 1206 can preferably be located in a region of the encapsulation bottom side 1202 corresponding to the die mount region of the integrated circuit packaging system 1100. For example, the thermal attach clusters can be located directly below the area or region that the integrated circuit 1124 is mounted. As a further example, the thermal attach clusters 1206 are non-continuous structures that do not attach or connect to one another.

The integrated circuit packaging system 1100 can include one or more of the thermal attach clusters 1206 exposed from the encapsulation bottom side 1202. The thermal attach clusters 1206 can be surrounded by the terminal pads 1126. The terminal pads 1126 can be exposed from the encapsulation bottom side 1202. The terminal pads 1126 are not connected to the thermal attach clusters 1206.

External interconnects 1230 can be attached to the terminal pads 1126 and the cluster pads 1208. The external interconnects 1230 are defined as a conductive structure for providing electrical and physical connection between structures or components. The external interconnects 1230 can provide electrical and physical connection between the integrated circuit packaging system 1100 and a next system level down (not shown).

It has been discovered that the thermal attach clusters 1206 improves the thermal characteristics of the integrated circuit packaging system 1100. For example, because the thermal attach clusters 1206 include the heat collector 1212 as an exposed structural element, the thermal attach clusters 1206 provide a larger surface area to dissipate heat than with the cluster pads 1208 and the terminal pads 1126 alone.

It has also been discovered that the thermal attach clusters 1206 having more than one of the cluster pads 1208 surrounding and connected to the heat collector 1212 provides more options and possibilities for routing. For example, the cluster pads 1208 can be formed in a tight or compact configuration allowing more space for routing while maintaining the surface area necessary for improved thermal or heat transfer for the integrated circuit packaging system 1100.

It has further been discovered that cutting or removing the cluster bridges 1210 and isolating one of the cluster pads 1208 from the heat collector 1212 can effectively shield the isolated one of the cluster pads 1208 from interference of the thermal attach clusters 1206.

It has yet further been discovered that the thermal attach clusters 1206 can provide improved board level reliability (BLR). The improvement in BLR is caused by the reduction in operating temperature, which can have a significant impact on the operational life by increasing the functional duration of the integrated circuit packaging system 1100.

Figure 13:
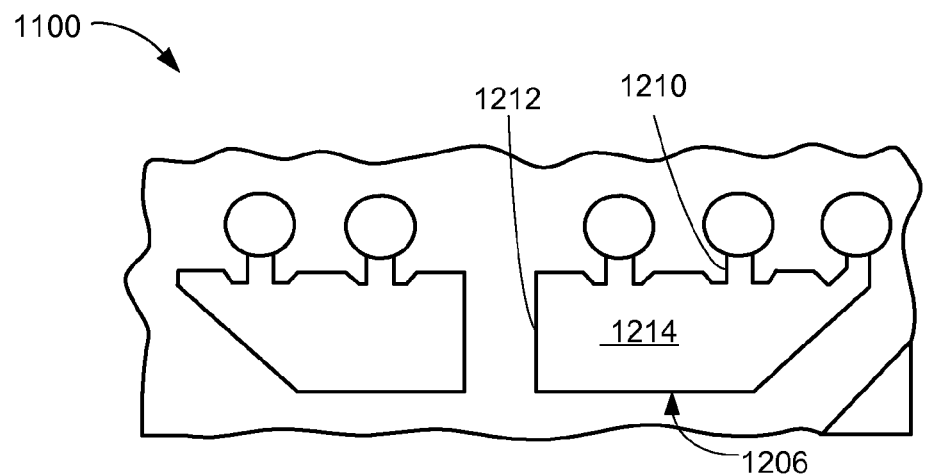
FIG. 13 is an expanded bottom view of a portion the integrated circuit packaging system of FIG. 12.

Referring now to FIG. 13, therein is shown an expanded bottom view of a portion the integrated circuit packaging system 1100 of FIG. 12. The expanded bottom view depicts one of the thermal attach clusters 1206. The heat collector 1212 is shown having the irregular shape. The surface area of the heat dissipation surface 1214 can be greater than the surface area of the exposed portion of the cluster bridge 1210.

Figure 14:
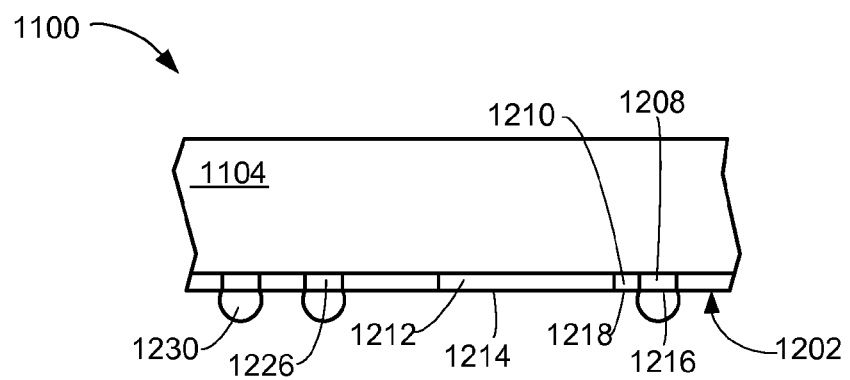
FIG. 14 is a cross-sectional view of the integrated circuit packaging system along line 14-14 of FIG. 12.

Referring now to FIG. 14, therein is shown a cross-sectional view of the integrated circuit packaging system 1100 along line 14-14 of FIG. 12. The cross-sectional view depicts the cluster pads 1208 having an attachment surface 1216. The attachment surface 1216 can be the portion of the cluster pads 1208 that is exposed from the encapsulation bottom side 1202 of the encapsulation 1104. The attachment surface 1216 can be coplanar with the encapsulation bottom side 1202, the heat dissipation surface 1214, or a combination thereof. The external interconnects 1230 can be attached to the attachment surface 1216 of the cluster pads 1208.

The external interconnects 1230 can be attached to the terminal pads 1226. The terminal pads 1226 can be exposed from the encapsulation 1104 along the encapsulation bottom side 1202. The exposed portion of the terminal pads 1226 can be coplanar with the encapsulation bottom side 1202.

The cluster bridges 1210 can have a thermal surface 1218. The thermal surface 1218 can be the portion of the cluster bridges 1210 that is exposed from the encapsulation bottom side 1202. The thermal surface 1218 can be coplanar with the encapsulation bottom side 1202 of the encapsulation 1104, the heat dissipation surface 1214 of the heat collector 1212, the attachment surface 1216 of the cluster pads 1208, or a combination thereof. The thermal surface 1218 can have a horizontal dimension that is less than that of the attachment surface 1216 and the heat dissipation surface 1214.

It has been discovered that the physical separation between the cluster pads 1208 and the heat collector 1212 provided by the cluster bridges 1210 can facilitate placement of the external interconnects 1230. For example, the relatively low surface area of the thermal surface 1218 of the cluster bridges 1210 can confine flow of the external interconnects 1230 to the attachment surface 1216 when attaching the external interconnects 1230 to the cluster pads 1208.

Figure 15:
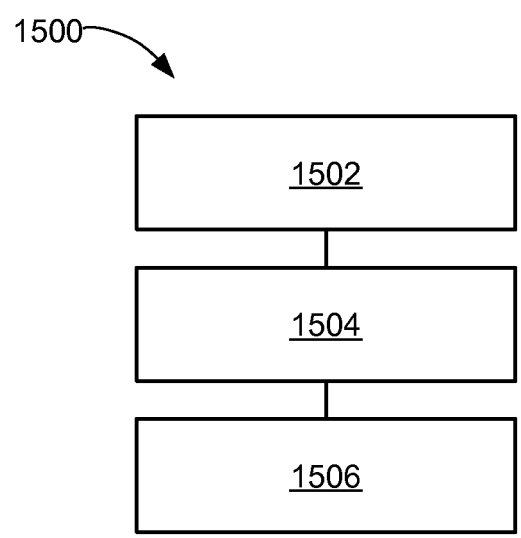
FIG. 15 is a flow chart of a method of manufacture of the integrated circuit packaging system in a further embodiment of the present invention.

Referring now to FIG. 15, therein is shown a flow chart of a method 1500 of manufacture of an integrated circuit packaging system in a further embodiment of the present invention. The method 1500 includes: forming a thermal attach cluster includes: forming a heat collector having a heat dissipation surface, forming a cluster bridge, having a thermal surface, connected to the heat collector, forming a cluster pad, having an attachment surface, connected to the end of the cluster bridge opposite the heat collector in a block 1502; connecting an integrated circuit to the thermal attach cluster in a block 1504; and forming an encapsulation over the thermal attach cluster with the heat dissipation surface, the thermal surface, and the attachment surface exposed from and coplanar with the encapsulation in a block 1506.

Thus, it has been discovered that the integrated circuit packaging system of the present invention furnishes important and heretofore unknown and unavailable solutions, capabilities, and functional aspects for an integrated circuit packaging system with connection. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit packaging system comprising:
    a thermal attach cluster including:
        a heat collector having a heat dissipation surface,
        a cluster bridge, having a thermal surface, connected to the heat collector,
        a cluster pad, having an attachment surface, connected to the end of the cluster bridge opposite the heat collector;
    an isolation pad surrounded by the heat collector with the isolation pad physically separated from the heat collector by an isolation groove;
    an integrated circuit connected to the thermal attach cluster; and
    an encapsulation over the thermal attach cluster, the heat dissipation surface, the thermal surface, and the attachment surface exposed from and coplanar with the encapsulation.

2. The system as claimed in claim 1 further comprising a heat collector pad in the heat collector with the heat collector pad partially separated from the heat collector by a selective peripheral groove.

3. The system as claimed in claim 1 wherein the thermal surface has a surface area less than the surface area of the heat dissipation surface.

4. The system as claimed in claim 1 wherein the attachment surface includes a mounting recess.

5. The system as claimed in claim 1 wherein the encapsulation includes an encapsulation bottom side, the heat dissipation surface, the thermal surface, and the attachment surface exposed from and coplanar with the encapsulation bottom side.

6. The system as claimed in claim 5 wherein the thermal surface has a surface area less than the surface area of the attachment surface.

7. The system as claimed in claim 5 wherein the encapsulation includes the thermal attach cluster at a central region of the encapsulation bottom side.

8. The system as claimed in claim 5 further comprising terminal pads surrounding the thermal attach cluster.

9. The system as claimed in claim 5 further comprising attaching an external interconnect to the attachment surface.

* * * * *